US011643133B2

(12) United States Patent
Couarraze

(10) Patent No.: US 11,643,133 B2
(45) Date of Patent: May 9, 2023

(54) ELECTRONIC DEVICE FOR DETERMINING THE ANGULAR POSITION OF A MOTOR VEHICLE SHAFT

(71) Applicants: CONTINENTAL AUTOMOTIVE FRANCE, Toulouse (FR); CONTINENTAL AUTOMOTIVE GMBH, Hannover (DE)

(72) Inventor: Stéphane Couarraze, Toulouse (FR)

(73) Assignees: CONTINENTAL AUTOMOTIVE FRANCE, Toulouse (FR); CONTINENTAL AUTOMOTIVE GMBH, Hannover (DE)

(*) Notice: Subject to any disclaimer, the term of this patent is extended or adjusted under 35 U.S.C. 154(b) by 390 days.

(21) Appl. No.: 16/956,203

(22) PCT Filed: Dec. 11, 2018

(86) PCT No.: PCT/FR2018/053194
§ 371 (c)(1),
(2) Date: Jun. 19, 2020

(87) PCT Pub. No.: WO2019/122595
PCT Pub. Date: Jun. 27, 2019

(65) Prior Publication Data
US 2020/0331518 A1 Oct. 22, 2020

(30) Foreign Application Priority Data
Dec. 21, 2017 (FR) ...................................... 1762709

(51) Int. Cl.
B62D 5/04 (2006.01)
B62D 15/02 (2006.01)
G01D 5/14 (2006.01)

(52) U.S. Cl.
CPC ......... *B62D 5/046* (2013.01); *B62D 15/0235* (2013.01); *G01D 5/14* (2013.01)

(58) Field of Classification Search
CPC ....... B62D 5/046; B62D 15/0235; G01D 5/14
(Continued)

(56) References Cited

U.S. PATENT DOCUMENTS 6,344,742 B1 2/2002 Kobayashi et al.
2003/0201681 A1 10/2003 Shimizu et al.
(Continued)

FOREIGN PATENT DOCUMENTS

CN 1781793 A 6/2006
CN 201075741 6/2008
(Continued)

OTHER PUBLICATIONS

International Search Report, PCT/FR2018/053194, dated May 7, 2019.
(Continued)

Primary Examiner — Mahmoud S Ismail
(74) Attorney, Agent, or Firm — Nixon & Vanderhye

(57) ABSTRACT

Disclosed is an electronic device for determining the angular position of a shaft of a motor vehicle, the device including a printed circuit board and a magnetic guide including at least two fastening tabs for fastening to the printed circuit board, the printed circuit board including a base substrate and at least two fastening areas for fastening the magnetic guide, each designed to receive a fastening tab of the magnetic guide, the fastening tab defining a fastening orifice. Each fastening area is defined on the base substrate of the printed circuit board and includes a pad fastened to the base substrate. Each fastening tab is joined to the pad of the corresponding fastening area by way of an adhesive that is applied in its fastening orifice.

20 Claims, 3 Drawing Sheets

(58) Field of Classification Search
USPC .......................................................... 180/444
See application file for complete search history.

(56) References Cited

U.S. PATENT DOCUMENTS

| | | | |
|---|---|---|---|
| 2007/0035938 A1 | 2/2007 | Rochford et al. | |
| 2013/0093415 A1* | 4/2013 | Moldenhauer | G01D 5/24442 |
| | | | 324/207.25 |
| 2013/0239712 A1* | 9/2013 | Arai | G01L 5/221 |
| | | | 74/89.2 |
| 2016/0083008 A1 | 3/2016 | Murakami et al. | |
| 2018/0023980 A1* | 1/2018 | Schoepe | G01D 5/2451 |
| | | | 324/207.25 |
| 2019/0113405 A1* | 4/2019 | Toyama | B62D 6/10 |
| 2019/0178681 A1* | 6/2019 | Tandjeu-Tchuissi | |
| | | | B62D 15/0245 |
| 2021/0197400 A1* | 7/2021 | Messier | A61B 34/30 |

FOREIGN PATENT DOCUMENTS

| | | |
|---|---|---|
| DE | 10 2015 204 781 A1 | 3/2016 |
| EP | 0916961 | 5/1999 |
| EP | 1884150 | 2/2008 |
| GB | 2 426 633 | 11/2006 |
| JP | 2005-037317 | 2/2005 |

OTHER PUBLICATIONS

Office Action issued in Chinese Patent Application No. 201880082562.1, dated Sep. 14, 2022.

* cited by examiner

ELECTRONIC DEVICE FOR DETERMINING THE ANGULAR POSITION OF A MOTOR VEHICLE SHAFT

This application is the U.S. national phase of International Application No. PCT/FR2018/053194 filed Dec. 11, 2018, which designated the U.S. and claims priority to French Patent Application No. 1762709 filed Dec. 21, 2017, the entire contents of each of which are hereby incorporated by reference.

BACKGROUND OF THE INVENTION

Field of the Invention

The present invention pertains to the field of position sensors and relates more particularly to an electronic device for determining the angular position of a shaft of a vehicle.

The invention is particularly applicable to determining the angular position of a shaft of a power steering system of a motor vehicle.

Description of the Related Art

A motor vehicle comprises, as is known, a power steering system for multiplying the force provided by the driver on the steering wheel. The driver is thus able to turn the wheels, in particular at a low speed of the vehicle, by providing a limited force.

Hydraulic power steering systems are known, but they are increasingly often being replaced with electrical systems in order to limit their costs and their bulk.

An electrical power steering system, as is known, comprises an electric motor driving a shaft in rotation in order to control the pivoting of the wheels. It is known to determine the angular position of this shaft in order in particular to determine the position of the wheels. For this purpose, a magnet is placed at one end of the shaft and an electronic device comprising a sensor, mounted on a printed circuit board, is placed to the right of the magnet in order to detect the magnetic field generated by the magnet and thus determine the angular position of the shaft.

In order that the magnetic field does not interfere with the other electronic components mounted on the printed circuit board, it is known to mount a magnetic guide around the sensor in order to channel the magnetic field.

As is known, this guide is in the form of a cylinder made of steel and mounted on the printed circuit board using fastening tabs that are welded into orifices formed in said printed circuit board.

However, fastening the guide to the printed circuit board in this way exhibits drawbacks because it is necessary to provide orifices that may prove to be bulky, thereby exhibiting a significant drawback for a complex printed circuit board on which free space is limited. In addition, creating such orifices and the welding operations necessary to fasten the tabs of the guide may prove time-consuming and expensive. Lastly, the welding operation may lead to a significant increase in temperature on the electronic circuit, which may damage it, and therefore exhibits a major drawback.

SUMMARY OF THE INVENTION

There is therefore a need for a solution that makes it possible to overcome these drawbacks at least in part.

The present invention aims to propose a simple, reliable and effective solution for fastening a magnetic guide to a printed circuit board.

To this end, the invention relates to an electronic device for determining the angular position of a shaft of a motor vehicle, said device comprising a printed circuit board, a magnetic sensor mounted on said printed circuit board and designed to measure the variations in a magnetic field generated by a magnet mounted on said shaft in order to determine the angular position of said shaft, and a magnetic guide comprising at least two fastening tabs for fastening to the printed circuit board, mounted around said magnetic sensor in order to channel said magnetic field, said printed circuit board comprising a base substrate on which an electrical circuit is printed, a protective varnish, applied to said electrical circuit, and at least two fastening areas for fastening said magnetic guide, each designed to receive a fastening tab of the magnetic guide, said fastening tab comprising an annular portion defining a fastening orifice. The device is noteworthy firstly in that each fastening area is defined on the base substrate of the printed circuit board and comprises a pad fastened to said base substrate, and secondly in that each fastening tab is joined to the pad of the corresponding fastening area by way of an adhesive that is applied in its fastening orifice.

"Base substrate" is understood to mean a carrier plate, for example an epoxy carrier plate. And "pad" is understood to mean an applied element mounted on the base substrate in order to increase the adhesion of the adhesive fastening of the fastening tabs.

By virtue of the device according to the invention, the magnetic guide is easily able to be adhesively fastened to the printed circuit board. In addition, by virtue of the fastening area, and in particular the pad, the strength of such adhesive bonding is optimum by virtue of the adhesion of the adhesive to the pad, and significantly greater than the adhesion of the adhesive to the base substrate. Specifically, the effectiveness of the adhesive between two metal materials makes it possible to increase the strength of the bond. Lastly, fastening the magnetic guide in this way does not require any welding, thereby making it possible to avoid heating of the protective varnish and the release of gas that would result therefrom and that could limit the effectiveness of the adhesive bonding to the printed circuit board.

Preferably, the magnetic guide comprises at least three fastening tabs and the printed circuit board comprises at least three fastening areas for fastening said fastening tabs in order to allow isostatic mounting of the magnetic guide on the printed circuit board.

Preferably, the fastening orifice has a diameter greater than or equal to 2.5 mm in order to allow the passage of the adhesive.

Advantageously, the pad has a circular cross section in order to optimize interaction with the fastening orifice, whose cross section is also circular.

According to a first embodiment of the invention, the pad has a diameter less than the internal diameter of the fastening orifice, preferably less than 1.5 mm, so that the adhesive adheres both to the pad and to the base substrate.

According to a second embodiment of the invention, the pad has a diameter greater than or equal to the internal diameter of the fastening orifice, preferably greater than or equal to 2.5 mm, more preferably of the order of 4 mm, in order to optimize the contact surface between the adhesive and the pad.

Preferably, the pad is made of a metal material in order to optimize the adhesion of the adhesive to said pad. For example, the pad may be made from a solder paste (which is a suspension of a metallic powder in a viscous liquid called a brazing flux), such as rosin for example.

More preferably, the pad has a height of the order of 120 micrometers so as to define a cylindrical surface, thereby increasing the contact surface with the adhesive.

Preferably, the adhesive that is used comprises an acrylate base that is easier to polymerize and that is particularly flexible for better resistance to thermal shocks.

The invention also relates to a power steering system for a motor vehicle comprising at least one electric motor driving a shaft in rotation and an electronic device, as described above, designed to determine the angular position of said shaft from a magnetic field generated by the shaft.

Preferably, the shaft comprises a magnet generating said magnetic field detected by the magnetic sensor. More preferably, with the shaft comprising one end placed facing the magnetic sensor, said magnet is mounted on said end of the shaft so as to be as close as possible to the magnetic sensor and thus optimize the detection of the magnetic field.

The invention furthermore targets a motor vehicle comprising at least two steered front wheels and a power steering system as described above, designed to drive the movement of said wheels.

BRIEF DESCRIPTION OF THE DRAWINGS

Other features and advantages of the invention will become apparent from the description that follows, which is provided with reference to the appended figures, which are provided by way of non-limiting example and in which identical reference signs are assigned to similar objects.

The device according to the invention is intended to be mounted in a vehicle, in particular a motor vehicle, in order to determine the angular position of a drive shaft of said vehicle.

DESCRIPTION OF THE PREFERRED EMBODIMENTS

Vehicle 1

In the example below, a description will be given of a device for determining the position of a shaft of a power steering system. However, it goes without saying that the device according to the invention could be used to determine the position of any other type of drive shaft of the vehicle.

Figure 1:
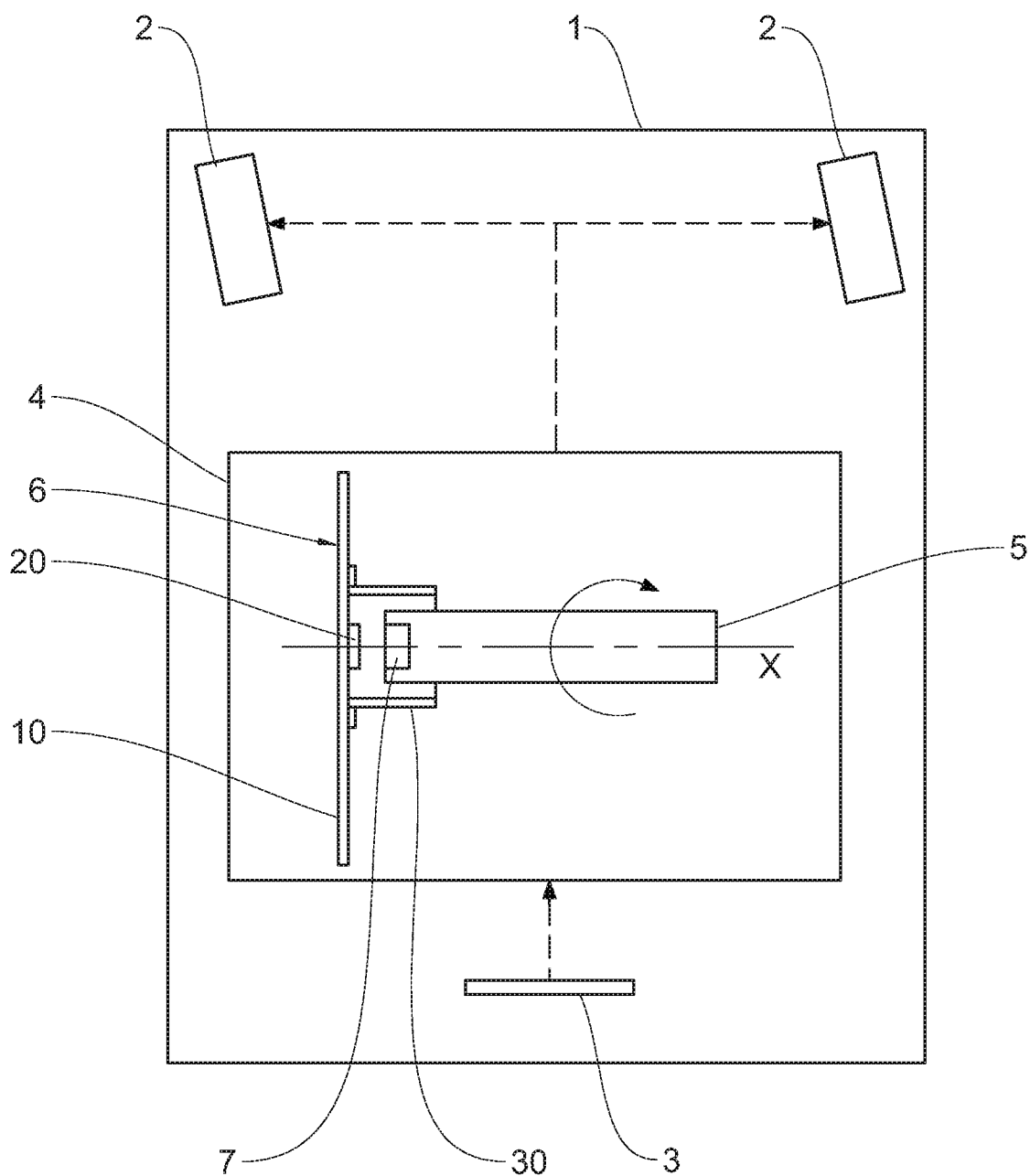
FIG. 1 schematically illustrates one embodiment of the motor vehicle according to the invention.

In the example illustrated in FIG. 1, the motor vehicle 1 comprises a chassis (not shown) that is resting on a traffic lane by way of four wheels. The two front wheels are denoted "steered wheels 2"; in other words, their axis of rotation is able to move so as to allow the vehicle 1 to change direction when moving on the traffic lane.

The steered wheels 2 are actuated by the steering wheel 3 of the vehicle 1. In order to limit the force that the driver has to provide on the steering wheel 3 in order to pivot the steered wheels 2, the vehicle 1 comprises a power steering system 4.

Such a power steering system 4 comprises a motor (not shown), preferably an electric motor, for assisting the pivoting of the steered wheels 2. More precisely, the motor of the steering system 4 makes it possible to multiply the force provided by the driver on the steering wheel 3 in order to pivot the steered wheels 2.

The power steering system 4 comprises a shaft 5 that is driven in rotation by the motor about an axis X of rotation. With the shaft 5 actuating the steered wheels 2, the position of the steered wheels 2 is linked to the angular position of this shaft 5.

Therefore, in order to ascertain the position of the steered wheels 2, the power steering system 4 comprises a device 6 for determining the angular position of the shaft 5 interacting with a magnet 7.

More precisely, this magnet 7 is mounted at one end of the shaft 5 and generates a magnetic field that is detected by the device 6 so that said device 6 determines the angular position of the shaft 5.

Device 6

The device 6 is an electronic device configured so as to measure the magnetic field generated by the magnet 7 in order to determine the angular position of the magnet 7 and therefore of the shaft 5 of the power steering system 4.

Figure 2:
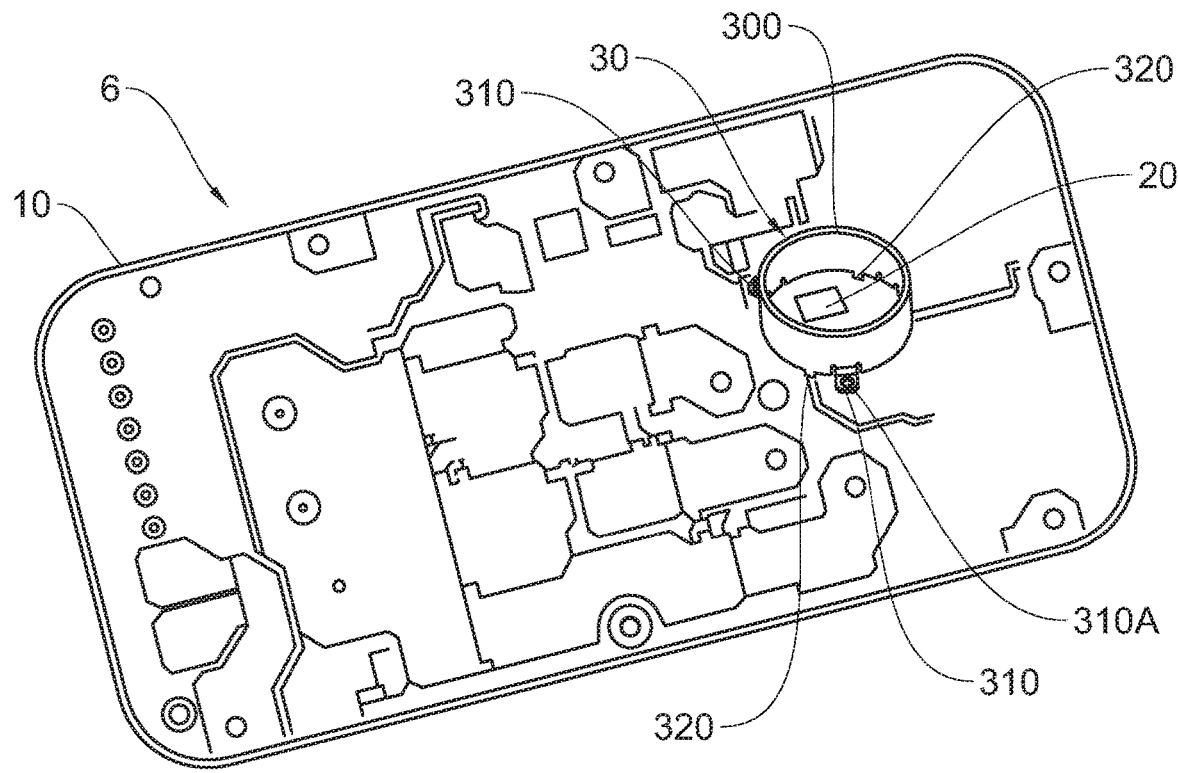
FIG. 2 is a schematic perspective view of one embodiment of the device of FIG. 1.

As illustrated in FIGS. 1 and 2, the device 6 comprises a printed circuit board 10, a magnetic sensor 20 designed to detect the magnetic field generated by the magnet 7, and a magnetic guide 30 designed to guide this magnetic field. According to one aspect of the invention, with reference to FIGS. 4 and 5, the device 6 also comprises piles of adhesive 40 for fastening the magnetic guide 30 to the printed circuit board 10, as will be described below.

Printed Circuit Board 10

Figure 3:
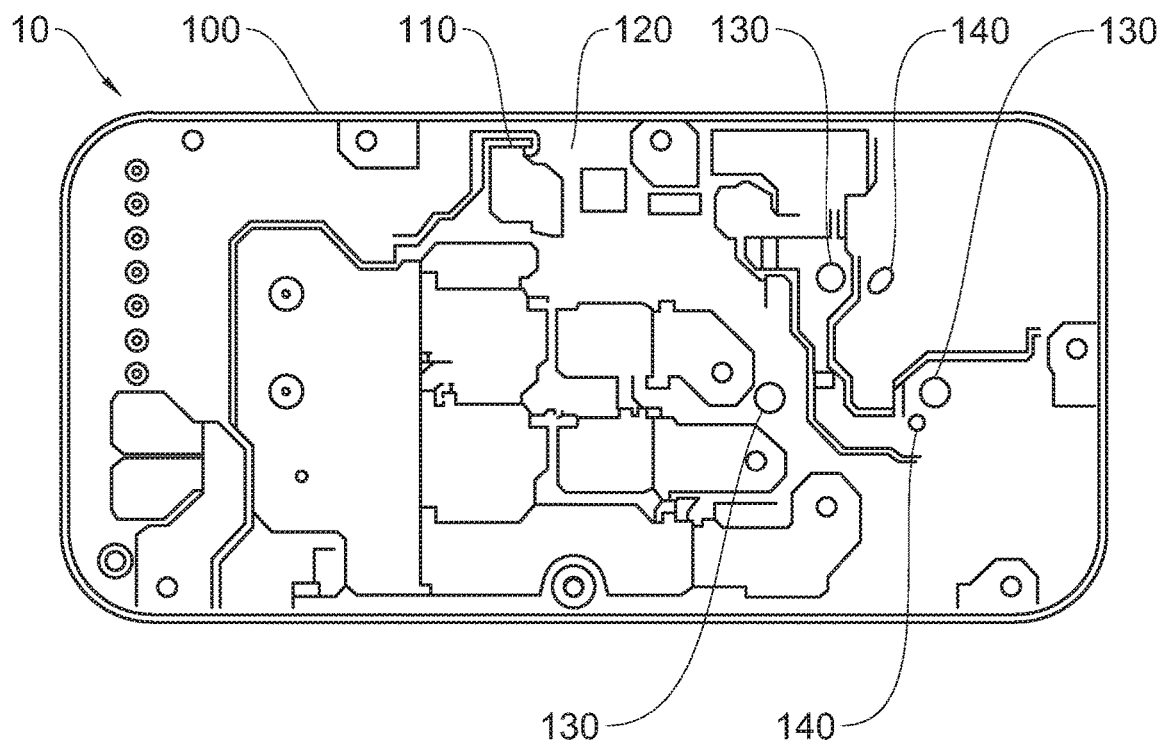
FIG. 3 is a schematic plan view of the printed circuit board of the device of FIG. 2.

With reference to FIG. 3, the printed circuit board 10 comprises a base substrate 100, an electrical circuit 110, printed on said base substrate 100, and a protective varnish 120 for protecting said electrical circuit 110, applied to the base substrate 100 so as to cover the electrical circuit 110.

The base substrate 100 is in the form of a plate, made for example of epoxy, on which electronic components are mounted.

The electrical circuit 110 makes it possible to electrically connect these various electronic components in order to operate the device 6. It will be noted that the choice of the number, the nature and the configuration of these electronic components and of the tracks of the electrical circuit 110 is left to a person skilled in the art in a manner known per se.

The protective varnish 120, also called resist mask, is applied to the electrical circuit 110 and allows same to be protected.

In this preferred example, the printed circuit board 10 comprises three fastening areas 130 for fastening the magnetic guide 30, thereby making it possible to fasten the magnetic guide 30 to the isostatic printed circuit board 10. It goes without saying that, in another embodiment of the device 6, the printed circuit board 10 could comprise more or fewer fastening areas 130.

Advantageously, the base substrate 100 furthermore comprises, in this example, two poka-yoke orifices 140 for mounting the magnetic guide 30 in a single position on the printed circuit board 10 in order to prevent incorrect mounting. It goes without saying that, in another embodiment of the device 6, the printed circuit board 10 could comprise more or fewer than two poka-yoke orifices 140 or not have any poka-yoke orifices 140. In this example again, the two poka-yoke orifices 140 have a different shape in order to facilitate mounting of the magnetic guide 30 in its position on the printed circuit board 10.

Magnetic Sensor 20

The magnetic sensor 20 is designed to detect the magnetic field generated by the magnet 7 mounted on the shaft 5 whose angular position it is desired to determine.

The magnetic sensor 20 is mounted on the printed circuit board 10 and is connected to the electrical circuit 110 such that the data measured by the magnetic sensor 20 are able to be exploited by an electronic unit of the vehicle 1, for example by the electronic control unit, also denoted ECU. For this purpose, the magnetic sensor 20 is mounted on the base substrate 100 and is electrically connected to the electrical circuit 110. Since such a magnetic sensor 20 is known, it will not be described in more detail.

The magnetic sensor 20 is placed facing the magnet 7. As illustrated in FIG. 1, the printed circuit board 10 is placed orthogonally to the axis X of rotation of the shaft and the magnetic sensor 20 is placed near, preferably aligned with, this axis X of rotation, as illustrated in FIG. 1.

Magnetic Guide 30

Again with reference to FIG. 2, the magnetic guide 30 comprises a cylindrical body 300, fastening tabs 310 and poka-yokes 320.

The cylindrical body 300 is not blind, that is to say is open at its two ends, and mounted on the printed circuit board 10 using the fastening tabs 310. The magnetic sensor 20 is mounted on the printed circuit board 10 inside said body 300 at one of its open ends, whereas the end of the shaft 5 comprising the magnet 7 extends into the body 300 through the other end of said body 300, as illustrated in FIG. 1.

In the position mounted on the power steering system 4, the magnet 7 is thus placed facing the magnetic sensor 20, such that the magnetic sensor 20 measures the magnetic field generated by the magnet 7.

The body 300 furthermore makes it possible to channel the magnetic field generated by the magnet 7 in the direction of the magnetic sensor 20. This makes it possible in particular to reduce interference of the magnet 7 with the other electronic components.

To this end, the body 300 is made of ferromagnetic material in order to guide the lines of the magnetic field inside the body 300.

Each fastening tab 310 is designed to be connected to a fastening area 130 of the printed circuit board 10.

In the example illustrated in FIG. 2, in which the printed circuit board 10 comprises three fastening areas 130, the magnetic guide 30 comprises three fastening tabs 310.

Fastening the magnetic guide 30 using three fastening tabs 310 advantageously allows isostatic mounting.

A fastening tab 310 is integral with the body 300 and extends in a manner projecting from that end of the body 300 at which the magnetic guide 30 is mounted on the printed circuit board 10. The fastening tab 310 extends orthogonally to the cylindrical body 300 so as to extend substantially parallel to the substrate 100 during mounting. As illustrated in FIG. 2, the fastening tab 310 has an elongated shape extending from the body 300 to a free end. The fastening tab 310 furthermore defines, in this preferred example, an orifice 310A at its free end. Such an orifice 310A has an internal diameter greater than or equal to 2.5 mm. The fastening tab 310 has a thickness greater than or equal to 1 mm. In other words, the orifice 310A extends over a length greater than or equal to 1 mm.

When the magnetic guide 30 is mounted on the printed circuit board 10, this orifice 310A is filled with the adhesive 40, as will be described later.

The poka-yokes 320 advantageously make it possible to guarantee correct positioning of the magnetic guide 30 in relation to the printed circuit board 10 during the operation of mounting the magnetic guide 30. In other words, each fastening tab 310 should be mounted on a predetermined fastening area 130.

A poka-yoke 320 is integral with the body 300 and extends in a manner projecting from that end of the body 300 at which the magnetic guide 30 is mounted on the printed circuit board 10. In other words, the poka-yoke 320 extends at the same end of the body 300 as the fastening tabs 310. The poka-yoke 320 extends parallel to the axis of the cylindrical body 300 so as to extend into a poka-yoke orifice 140 during mounting, with reference to FIG. 3.

Each poka-yoke 320 is designed to be mounted in a predetermined poka-yoke orifice 140. In order to guarantee such mounting, the position of the poka-yoke orifices 140 on the substrate 100 is designed such that just one position of the magnetic guide 30 is possible. In the example illustrated in FIG. 3, each of the two poka-yoke orifices 140 is placed near a fastening area 130. No poka-yoke orifice 140 is placed near the third fastening area 130, thereby making it possible to easily determine the mounting position of the magnetic guide 30 on the printed circuit board 10. In order to further improve such a poka-yoke mechanism, the poka-yoke orifices 140, and similarly the poka-yokes 320, have a different shape. Each poka-yoke 320 is therefore able to be placed only in one poka-yoke orifice 140.

Adhesive 40

In order to fasten the magnetic guide 30 to the printed circuit board 10, a pile of adhesive 40 is placed in the orifice 310A defined by each fastening tab 310. The adhesive 40 then adheres to the fastening tab 310 as well as to the fastening area 130 in order to connect them to one another, as illustrated in FIGS. 4 and 5.

Fastening Area 130

A fastening area 130 is defined on the base substrate 100. Such a fastening area 130 is a surface of the base substrate 100 that is not covered with protective varnish 120. In other words, in the fastening area 130, the base substrate 100 is in contact with ambient air. The fastening area 130 has a diameter greater than or equal to the internal diameter of the orifice 310A defined by the fastening tab 310 of the magnetic guide 30. Preferably, the fastening area 130 has a diameter greater than or equal to 4 mm.

Figure 4:
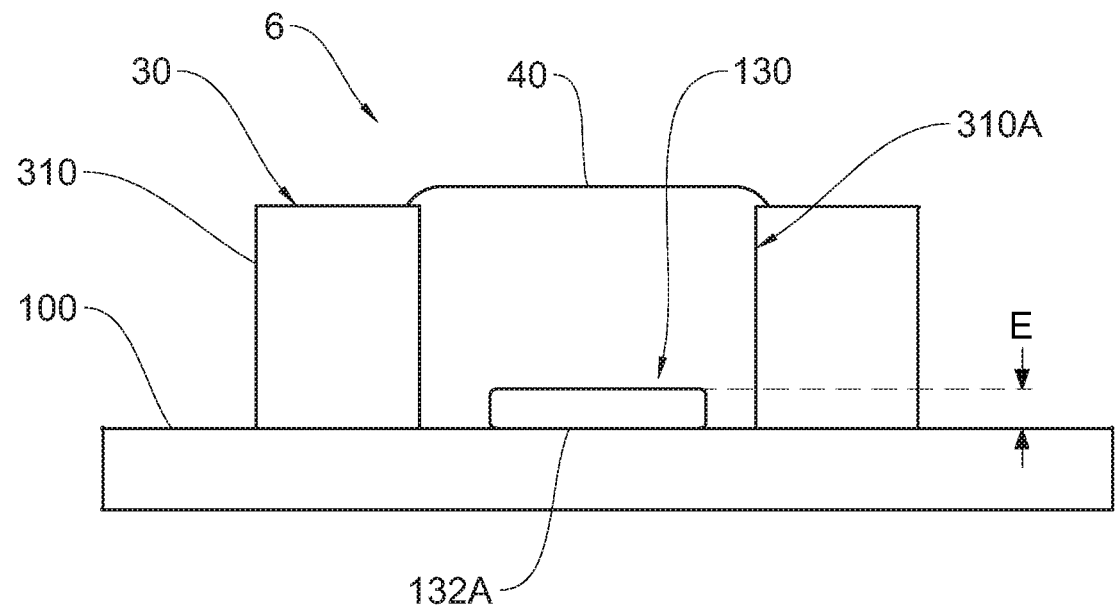
FIGS. 4 and 5 schematically illustrate two embodiments of the printed circuit board of FIG. 3.
Figure 5:
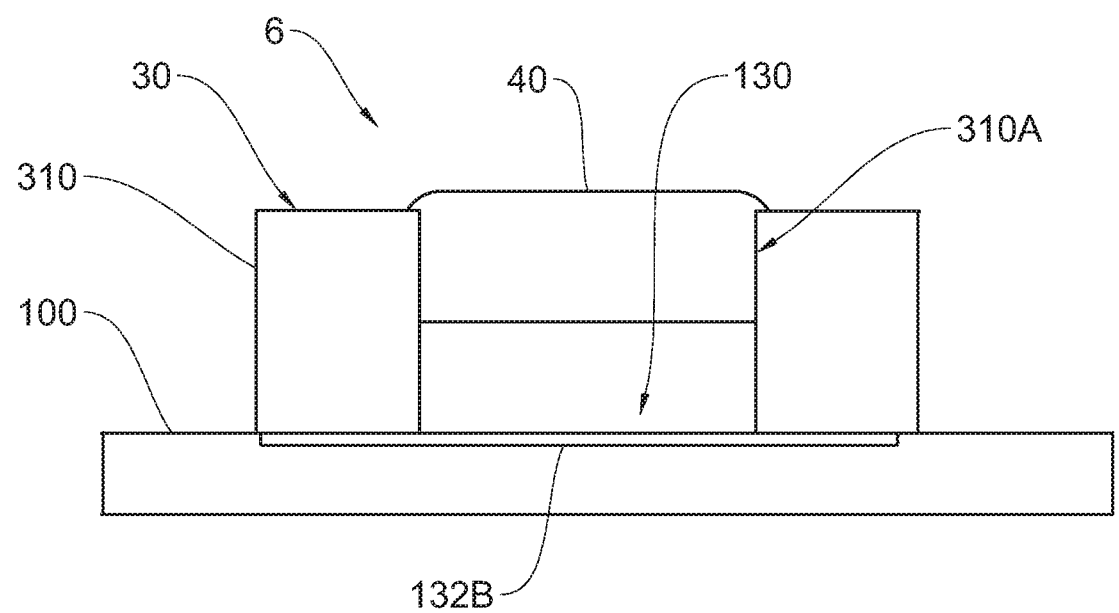

According to one aspect of the invention, with reference to FIGS. 4 and 5, each fastening area 130 comprises a pad 132A, 132B arranged on the base substrate 100. Such a pad 132A, 132B is an applied component that is joined to the base substrate 100, as will be presented below. The pad 132A, 132B has a circular cross section.

In this example, the pad 132A, 132B is made of a metal material having sufficient porosity to allow the adhesive 40 to adhere to the pad 132A, 132B.

A fastening tab 310 is adhesively fastened to a fastening area 130.

First Embodiment: Pad 132A

According to a first embodiment of a fastening area 130 illustrated in FIG. 4, the pad 132A has a diameter less than 1.5 mm. In other words, the pad 132A has a diameter smaller than that of the fastening area 130. Part of the base substrate 100 is thus covered neither by the pad 132A nor by the protective varnish 120 in the fastening area 130.

The adhesive 40 thus adheres both to the pad 132A and to the uncovered base substrate 100, thereby making it possible to optimize the strength of the adhesive bonding of the magnetic guide 30 to the printed circuit board 10.

The pad 132A has a height E less than 0.15 mm, preferably of the order of 120 micrometers. Such a thickness of the pad 132A thus makes it possible to define a cylindrical surface of the pad 132A to which the adhesive 40 adheres, increasing the contact surface between the pad 132A and the adhesive 40, thereby making it possible to further increase the strength of the adhesive bonding of the magnetic guide 30 to the pad 132A.

Second Embodiment: Pad 132B

According to a second embodiment of a fastening area 130 illustrated in FIG. 5, the pad 132B has a diameter greater than or equal to 2.5 mm, preferably of the order of 4 mm. Such a pad 132B thus covers the entire surface of the base substrate 100 that is not covered with protective varnish 120.

Such a pad 132B thus makes it possible to maximize the contact surface between the pad 132B and the adhesive 40 in order to increase the mechanical strength of such adhesive bonding.

According to one aspect of the invention, the pad 132B is contained within the thickness of the base substrate 100. In other words, the pad 132B does not project from the base substrate 100.

Implementation of the Invention

A description will now be given of the method for manufacturing a fastening area 130.

First of all, a pad 132A, 132B is placed on the base substrate 100 in each fastening area 130. Such a pad 132A initially has a greater thickness, preferably greater than 150 micrometers.

The base substrate 100 is then placed in a furnace in order to heat the pad 132A and for said pad to join to the base substrate 100. To this end, part of the pad 132A penetrates into the base substrate 100.

After this joining step, the pad 132A has a thickness less than its initial thickness.

In one alternative embodiment, the pad 132B is a thickness, preferably less than 10 micrometers, of a material, for example tin, placed on a tin-plated copper surface of the base substrate 100.

Then, when the protective varnish 120 is applied to the base substrate 100, masks are placed on each fastening area 130 so that the base substrate 100 is not covered with protective varnish 120.

The fastening tabs 310 may then be placed on the fastening areas 130 and adhesive may be applied to each fastening tab 310 so as to join said fastening tab 310 to the pad 132A and the base substrate 100 in the first embodiment, or only to the pad 132B in the second embodiment.

The invention claimed is:

1. An electronic device for determining an angular position of a shaft of a motor vehicle, said electronic device comprising:
  a printed circuit board;
  a magnetic sensor mounted on said printed circuit board and configured to measure variations in a magnetic field generated by a magnet mounted on said shaft in order to determine the angular position of said shaft; and
  a magnetic guide comprising at least two fastening tabs configured to fasten to the printed circuit board, the magnetic guide being mounted around said magnetic sensor in order to channel said magnetic field,
  wherein said printed circuit board comprises
    a base substrate on which an electrical circuit is printed,
    a protective varnish, applied to said electrical circuit, and
    at least two fastening areas configured to fasten said magnetic guide, each of the at least two fastening areas being configured to receive a fastening tab of the magnetic guide, said fastening tab comprising an annular portion defining a fastening orifice, each of the at least two fastening areas being defined on the base substrate of the printed circuit board, each of the at least two fastening areas comprising a pad fastened to said base substrate, each of the fastening tabs is joined to the pad of the corresponding fastening area by an adhesive that is applied in a fastening orifice of the respective fastening tab.

2. The electronic device as claimed in claim 1, wherein the pad has a circular cross-section.

3. The electronic device as claimed in claim 2, wherein the pad has a diameter less than the internal diameter of the fastening orifice.

4. The electronic device as claimed in claim 3, wherein the magnetic guide comprises at least three fastening tabs and the printed circuit board comprises at least three fastening areas configured to fasten said fastening tabs.

5. The electronic device as claimed in claim 3, wherein the pad is made of a metal material.

6. The electronic device as claimed in claim 3, wherein the pad has a height of 120 micrometers.

7. The electronic device as claimed in claim 2, wherein the pad has a diameter greater than or equal to the internal diameter of the fastening orifice.

8. The electronic device as claimed in claim 7, wherein the magnetic guide comprises at least three fastening tabs and the printed circuit board comprises at least three fastening areas configured to fasten said fastening tabs.

9. The electronic device as claimed in claim 7, wherein the pad is made of a metal material.

10. The electronic device as claimed in claim 7, wherein the pad has a height of 120 micrometers.

11. The electronic device as claimed in claim 2, wherein the magnetic guide comprises at least three fastening tabs and the printed circuit board comprises at least three fastening areas configured to fasten said fastening tabs.

12. The electronic device as claimed in claim 2, wherein the pad is made of a metal material.

13. The electronic device as claimed in claim 2, wherein the pad has a height of 120 micrometers.

14. The electronic device as claimed in claim 1, wherein the magnetic guide comprises at least three fastening tabs and the printed circuit board comprises at least three fastening areas configured to fasten said fastening tabs.

15. The electronic device as claimed in claim 14, wherein the pad is made of a metal material.

16. The electronic device as claimed in claim 1, wherein the pad is made of a metal material.

17. The electronic device as claimed in claim 1, wherein the pad has a height of 120 micrometers.

18. A power steering system for a motor vehicle, said power steering system comprising:
  at least one electric motor driving a shaft in rotation and an electronic device configured to determine an angular position of said shaft from a magnetic field generated by the shaft, the electronic device comprising
    a printed circuit board,
    a magnetic sensor mounted on said printed circuit board and configured to measure variations in a magnetic field generated by a magnet mounted on said shaft in order to determine the angular position of said shaft, and a magnetic guide comprising at least two fastening tabs configured to fasten to the printed circuit board, the magnetic guide being mounted around said magnetic sensor in order to channel said magnetic field, wherein said printed circuit board comprises a base substrate on which an electrical circuit is printed, a protective varnish applied to said electrical circuit, and at least two fastening areas configured to fasten said magnetic guide, each of the at least two fastening areas being configured to receive a fastening tab of the magnetic guide, said fastening tab comprising an annular portion defining a fastening orifice, each of the at least two fastening areas being defined on the base substrate of the printed circuit board, each of the at least two fastening areas comprising a pad fastened to said base substrate, each of the fastening tabs is joined to the pad of the corresponding fastening area by an adhesive that is applied in a fastening orifice of the respective fastening tab.

19. The power steering system as claimed in claim 18, wherein the shaft comprises a magnet generating said magnetic field.

20. A motor vehicle comprising:

at least two steered front wheels; and a power steering system configured to drive movement of said wheels, the power steering system comprising at least one electric motor driving a shaft in rotation and an electronic device configured to determine an angular position of said shaft from a magnetic field generated by the shaft, the electronic device comprising a printed circuit board, a magnetic sensor mounted on said printed circuit board and configured to measure variations in a magnetic field generated by a magnet mounted on said shaft in order to determine the angular position of said shaft, and a magnetic guide comprising at least two fastening tabs configured to fasten to the printed circuit board, the magnetic guide being mounted around said magnetic sensor in order to channel said magnetic field, wherein said printed circuit board comprises a base substrate on which an electrical circuit is printed, a protective varnish applied to said electrical circuit, and at least two fastening areas configured to fasten said magnetic guide, each of the at least two fastening areas being configured to receive a fastening tab of the magnetic guide, said fastening tab comprising an annular portion defining a fastening orifice, each of the at least two fastening areas being defined on the base substrate of the printed circuit board, each of the at least two fastening areas comprising a pad fastened to said base substrate, each of the fastening tabs is joined to the pad of the corresponding fastening area by an adhesive that is applied in a fastening orifice of the respective fastening tab.

* * * * *